United States Patent [19]

Kamon

[11] Patent Number: 5,365,371
[45] Date of Patent: Nov. 15, 1994

[54] PROJECTION EXPOSURE APPARATUS

[75] Inventor: Kazuya Kamon, Itami, Japan

[73] Assignee: Mitsubishi Denki Kabushiki Kaisha, Tokyo, Japan

[21] Appl. No.: 14,144

[22] Filed: Feb. 5, 1993

[30] Foreign Application Priority Data

Feb. 10, 1992 [JP] Japan ................. 4-023743

[51] Int. Cl.$^5$ .................... G02B 5/30; G02B 27/28
[52] U.S. Cl. .................... 359/483; 355/53; 359/485; 359/489; 359/494; 359/495
[58] Field of Search ............... 359/483, 485, 489, 493, 359/495, 494; 355/53; 250/225

[56] References Cited

U.S. PATENT DOCUMENTS

| | | | |
|---|---|---|---|
| 2,458,437 | 1/1949 | Smith | 359/485 |
| 2,535,781 | 12/1950 | Burchell | 359/489 |
| 2,837,087 | 6/1958 | Sawyer | 359/489 |
| 3,051,054 | 8/1962 | Crandon | 359/483 |
| 3,437,401 | 4/1969 | Siksai | 359/489 |
| 3,833,289 | 9/1974 | Schuler | 359/483 |
| 4,286,843 | 9/1981 | Reytblatt | 359/489 |
| 5,048,926 | 9/1991 | Tanimoto | 359/495 |
| 5,153,773 | 10/1992 | Muraki et al. | 359/495 |
| 5,245,470 | 9/1993 | Keum | 359/489 |

Primary Examiner—Martin Lerner
Attorney, Agent, or Firm—Leydig, Voit & Mayer

[57] ABSTRACT

A projection exposure apparatus includes a light source, a condenser lens for condensing an illumination light emanating from the light source onto a mask including a circuit pattern, a projection lens for condensing onto a surface of a wafer the illumination light that has passed through the mask, and a polarizer disposed on a surface of a pupil of the projection lens for converting the illumination light converged onto the surface of the wafer into polarized light having radial planes of polarization intersecting the optical axis of the projection lens.

4 Claims, 6 Drawing Sheets

PROJECTION EXPOSURE APPARATUS

BACKGROUND OF THE INVENTION

1. Field of the Invention

The present invention relates to a projection exposure apparatus for forming fine patterns required for manufacture of LSIs, as well as a polarizer for use in such a projection exposure apparatus.

2. Description of the Related Art

FIG. 8 shows an optical system of a conventional projection exposure apparatus. The optical system includes a lamp house 1, a mirror 2, a fly's eye lens 3 disposed in the front the lamp house 1 with the mirror 2 between the lamp house 1 and the fly's eye lens 3, an aperture member 4 located in front of the fly's eye lens 3, a relay lens 5A, a stop 6, a mirror 7, a condenser lens 5B, a photo mask 8 on which a circuit pattern is formed, a projection lens 9, and a wafer 10 with the projection lens 9 between the mask 8 and the wafer 10.

Light rays emanating from the lamp house 1 reach the fly's eye lens 3 through the mirror 2, and are split into regions by the individual lenses 3a of the fly's eye lens 3. The rays which have passed through the individual lenses 3a pass through an aperture portion 4a of the aperture member 4, the relay lens 5A, the stop 6, the mirror 7 and the condenser lens 5B, and illuminate the entire surface of the exposure area of the mask 8. Therefore, on the surface of the mask 8, the rays from the individual lenses 3a of the fly's eye lens 3 are laid on top of one another, and the mask 8 is thus uniformly illuminated. The light rays which have passed through the mask 8 in the manner described above pass through the projection lens 9 and then reach the wafer 10. A resist film on the surface of the wafer 10 is exposed to this illumination light, whereby transfer of the circuit pattern is achieved.

As a result, a resist pattern is formed on the surface of the wafer 10. When the illumination light illuminates the wafer 10, part of the illumination light passes through the resist film and is then reflected by the surface of the wafer 10, generating a standing light wave corresponding to the thickness of the resist film. Thus, the dimensions of the resist pattern vary according to the local thickness of the resist, deteriorating the resist pattern accuracy.

SUMMARY OF THE INVENTION

Accordingly, an object of the present invention is to provide a projection exposure apparatus preventing deterioration in the resist pattern accuracy due to a standing light wave.

Another object of the present invention is to provide a polarizer preventing generation of standing light waves.

In order to achieve the above object, according to one aspect of the present invention, there is provided a projection exposure apparatus which comprises a light source, a condenser lens for condensing an illumination light emanating from the light source on a mask on which a circuit pattern has been formed, a projection lens for condensing on a surface of a wafer the illumination light which has passed through the mask, and a polarizer disposed on the surface of a pupil of the projection lens for converting the illumination light converged onto the surface of the wafer into polarized light having radial planes of polarization with respect to an optical axis of the projection lens.

According to another aspect of the present invention, there is provided a polarizer which comprises a first conical lens having a concave form, and a second conical lens having a convex form and made of a material having an index of refraction different from the index of refraction of the first conical lens, the second conical lens being fitted into a concave portion of the first conical lens. The polarizer converts incident light parallel to axes of the first and second conical lenses into polarized light having radial planes of polarization with respect to the axes.

According to another aspect the present invention, a polarizer comprises a plurality of linearly polarizing filters each having a fan-like shape having a predetermined central angle, the linearly polarizing filters being disposed in a radial fashion about a common center forming a disk shape, the linearly polarizing filters passing therethrough polarized light having planes of polarization along radial directions of the disk shape. The polarizer converts incident light thereon parallel to a central axis which passes through the common center and is perpendicular to the disk into polarized light having radial planes of polarization with respect to the central axis.

DESCRIPTION OF THE PREFERRED EMBODIMENTS

Embodiments of the present invention will be described below with reference to the accompanying drawings.

A first embodiment of the present invention will now be described with reference to FIGS. 1 through 4.

Figure 1:
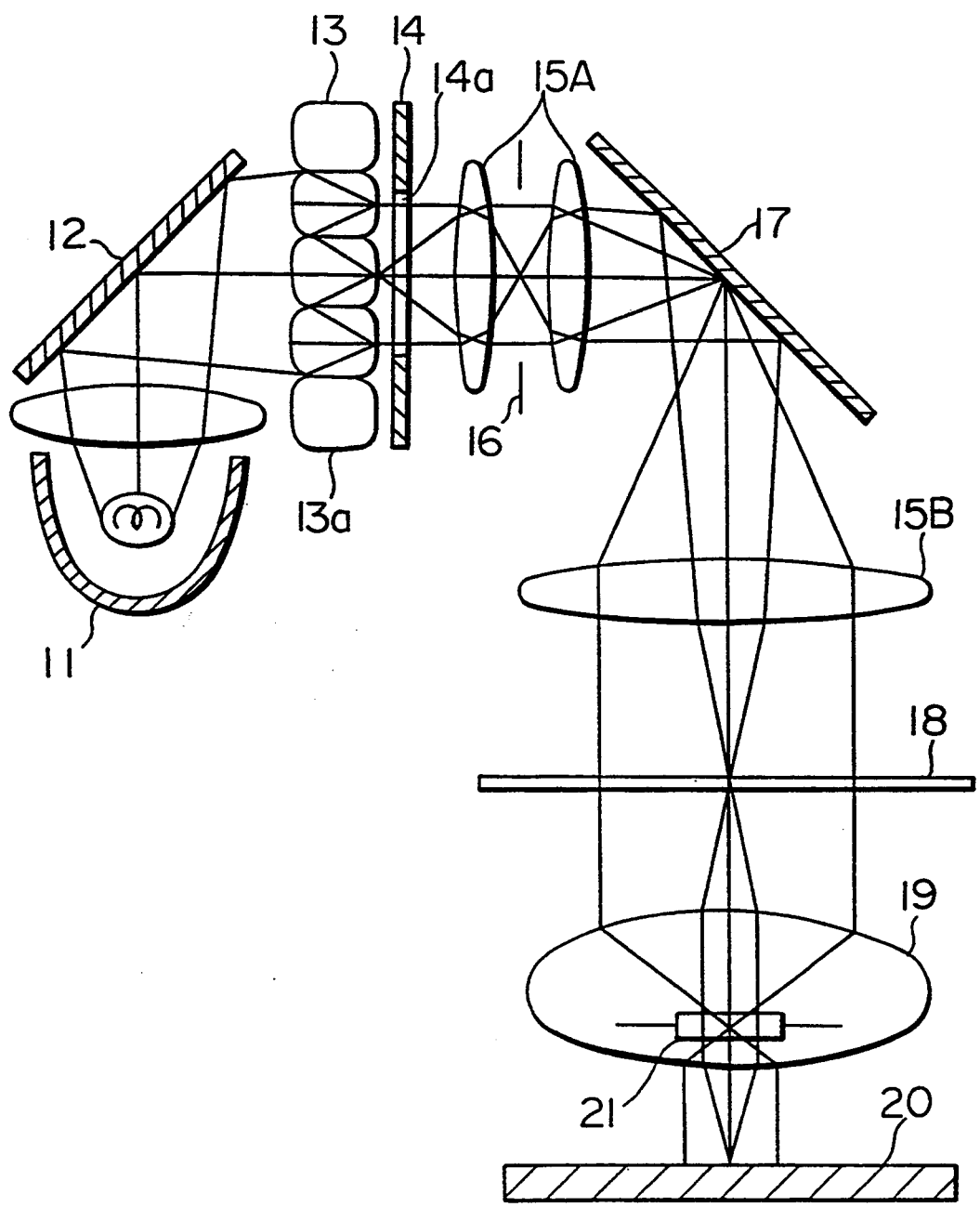
FIG. 1 shows an optical system of a projection exposure apparatus according to a first embodiment of the present invention.

Referring first to FIG. 1, an exposure apparatus includes a lamp house 11 emanating illumination light, a mirror 12, a fly's eye lens 13 disposed in front of the lamp house 11 with the mirror 12 between the lamp house 11 and the fly's eye lens 13, an aperture member 14 located in front of the fly's eye lens 13, a relay lens 15A, a stop 16, a mirror 17, a condenser lens 15B, a photo mask 18 on which a circuit pattern is formed, a projection lens 19, and a wafer with the projection lens 19 between the mask 18 and the wafer 20. A polarizer 21 is disposed on the surface of the pupil of the projection lens 19 in order to convert the illumination light into polarized light having radial polarization with respect to the optical axis of the projection lens 19.

The operation of this embodiment will be described below. The illumination light emanating from the lamp house 11 reaches the fly's eye lens 13 through the mirror 12, and is split into regions corresponding to individual lenses 13a of the fly's eye lens 13. The light rays emanating from the individual lenses 13a pass through the aperture portion of the aperture member 14, the relay lens 15A, the stop 16, the mirror 17 and the condenser lens 15B, and then illuminate the entire surface of the exposure area of the mask 18. Therefore, on the surface of the mask 18, the light rays from the individual lenses 13a of the fly's eye lens 13 are laid on top of one another, and the mask surface is thus illuminated uniformly. The light which has passed through the mask 18 in the manner described above, is converted to polarized light by the polarizer 21 disposed on the surface of the pupil of the projection lens, 19, and then reaches the wafer 20. A resist film on the surface of the wafer 20 is exposed to the illumination light, whereby transfer of the circuit pattern is achieved.

Figure 2:
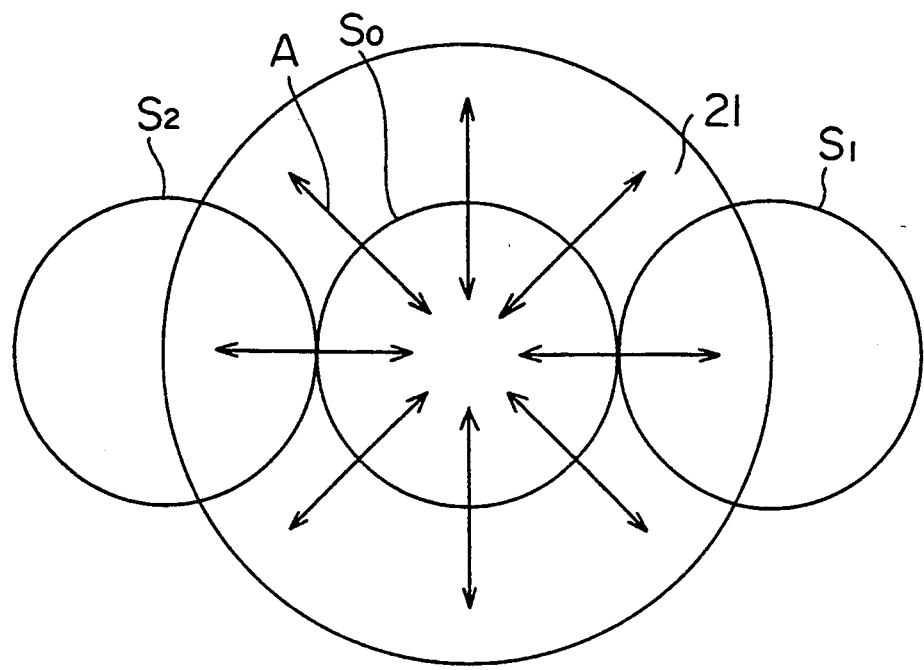
FIG. 2 is a plan view of a polarizer employed in the first embodiment.

FIG. 2 is a plan view of the polarizer 21 which converts the illumination light which passes therethrough into polarized light having the radial planes of polarization indicated by bidirectional arrows A. Since the polarizer 21 is located on the surface of the pupil of the projection lens 19, if the circuit pattern on the mask 18 has parallel lines close to the a resolution limit of the lens 19, a light source image $S_0$ of the zeroth order and light source images $S_1$ and $S_2$ of the ± first order are formed on the polarizer 21, as shown in FIG. 2.

Figure 3:
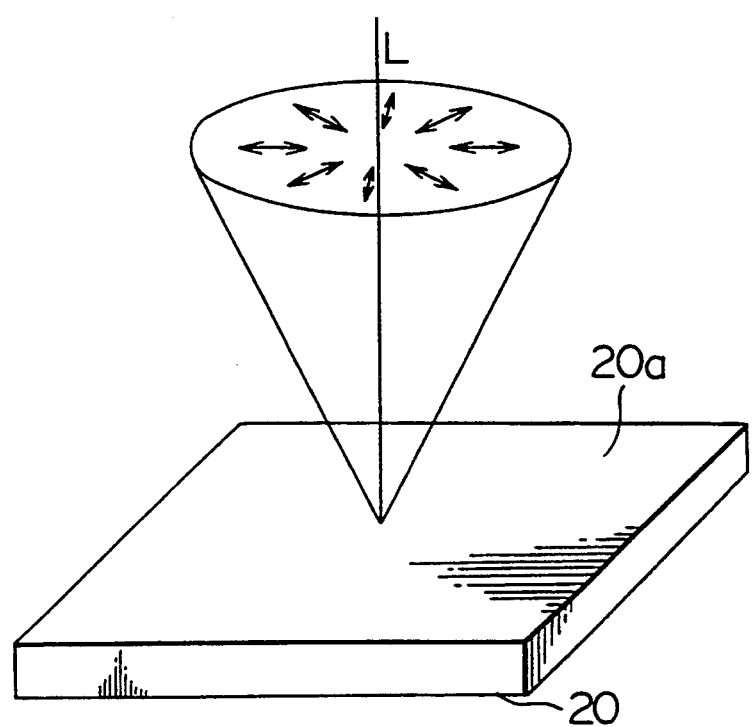
FIG. 3 shows how a light is converged onto a wafer in the first embodiment.

The rays of illumination light which have been converted into polarized lights by the polarizer 21 are converged onto the wafer 20 with radial planes of polarization with respect to an optical axis L, as shown in FIG. 3. In other words, the illumination light is incident on a principal plane 20a of the wafer 20 in the form of p-polarized light.

The reflectance Rp of the p-polarized light and the reflectance Rs of the s-polarized light when the angle of incidence is $\theta i$ and the angle of transmission is $\theta t$ are given by the following equations:

$$Rp = \tan^2(\theta i - \theta t)/\tan^2(\theta i + \theta t)$$

$$Rs = \sin^2(\theta i - \theta t)/\sin^2(\theta i + \theta t)$$

Figure 4:
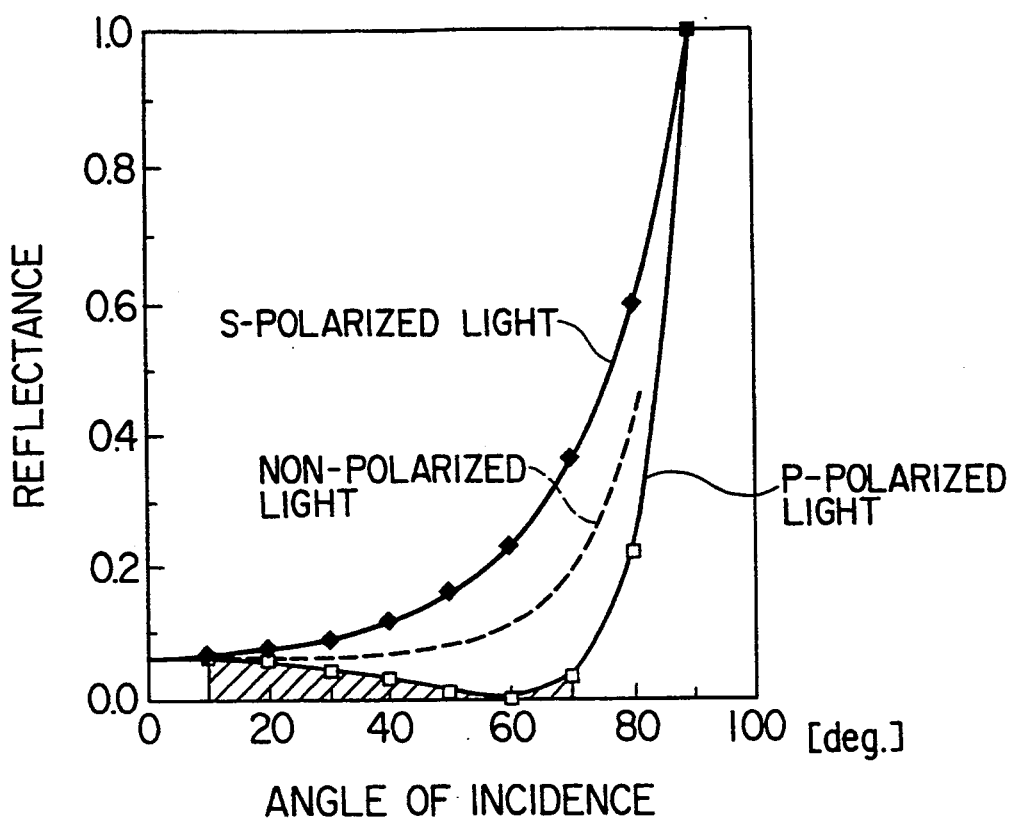
FIG. 4 shows the relationship between the angle of incidence and the reflectances of p-polarized light and of an s-polarized light.

FIG. 4 shows the relation between the reflectances of p-polarized light and s-polarized light and the angle of incidence on an inclined surface made of a resist having an index of refraction n of 1.68. The reflectance of the p-polarized light is smaller than that of the s-polarized light on the whole. Particularly, the reflectance of the p-polarized light is reduced to zero when the angle of incidence is the angle of polarization. In the example shown in FIG. 4, the angle of polarization is about 60 degrees. The broken line in FIG. 4 indicates the reflectance of non-polarized light.

In the projection exposure apparatus shown in FIG. 1, since the illumination light is incident on a single spot on the surface of the wafer 20 at an convergent angle of about 30 degrees, if an inclined surface having an inclination angle of, for example, 40 degrees is present on the surface of the wafer 20, the actual angle of incidence at which the light is incident on the inclined surface ranges between 10 and 70 degrees. Therefore, the area obtained by integrating the curve representing the reflectance in FIG. 4 in the range of angles of incidence from 10 degrees and 70 degrees corresponds to the intensity of light which is reflected by the inclined surface having the inclination angle of 40 degrees. More specifically, when a p-polarized light alone illuminates the resist for exposure, the intensity of the light which is reflected by the inclined surface corresponds to the area indicated by a hatched portion in FIG. 4, and is thus less than half of the intensity of light reflected when non-polarized light is used.

Thus, when the polarizer 21 is disposed so that the illumination light is incident on the wafer 20 in the form of p-polarized light with respect to the principal plane 20a of the wafer 20, the intensity of light reflected by the surface of the wafer 20 is reduced, thus restricting the generation of standing light waves caused by the reflected light and preventing variations in the dimensions in the resist which would occur according to the local thickness of the resist film.

Figure 5:
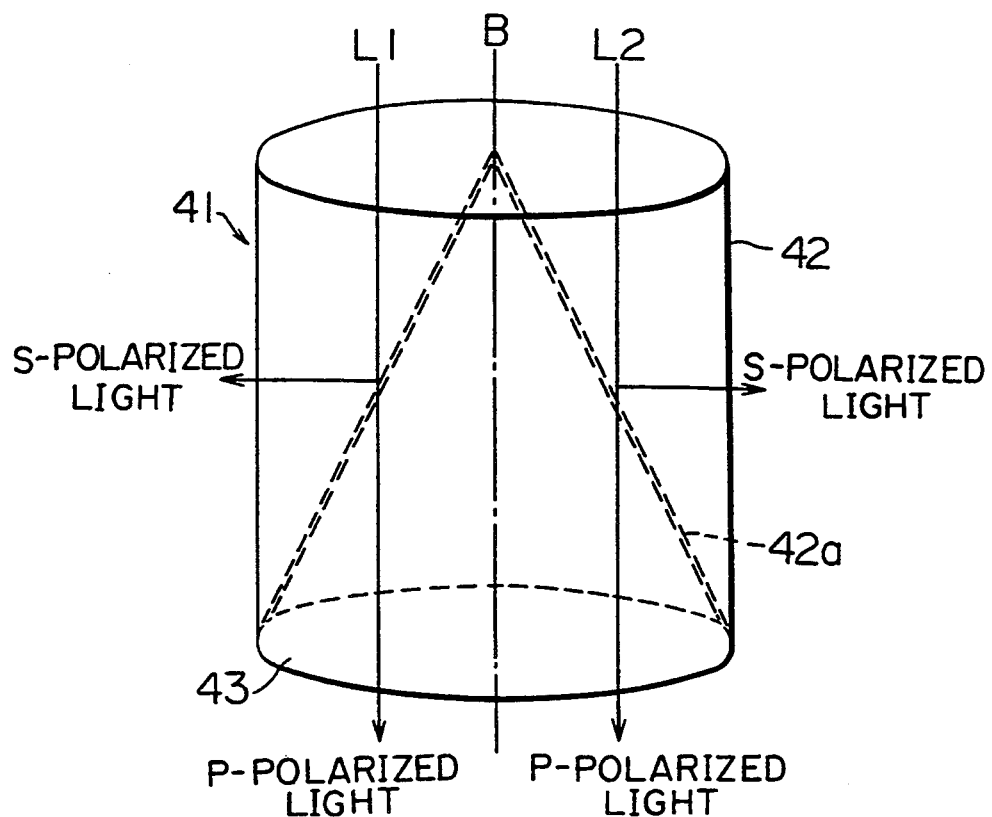
FIG. 5 is a perspective view of a polarizer employed in a second embodiment of the present invention.

As a polarizer for providing radially polarized light, a polarizer 41 shown in FIG. 5 may also be employed. The polarizer 41 consists of a first conical lens 42 having a concave form, and a second conical lens 43 having a convex form. The concave first conical lens 42 has a conical concave portion 42a, and the second conical lens 43 is fitted into this concave portion 42a. In addition, the first and second conical lenses 42 and 43 are made of materials having different indexes of refraction. Therefore, light beam L1 and L2 incident on the polarizer 41 parallel to a central axis B of the first and second conical lenses 42 and 43 are separated into p-polarized light and s-polarized light at the contact surface of the two conical lenses 42 and 43. The p-polarized light propagates straight ahead while the s-polarized light is reflected in the radial direction of the cones. In other words, the polarizer 41 acts as a polarized beam splitter. It is, however, to be noted that the contact surface between the conical lenses 42 and 43 has a conical form and hence the light which is incident on the polarizer 41 parallel to the central axis B and then propagates straight ahead within the polarizer 41 is converted into polarized light having the radial planes of polarization with respect to the central axis B.

Figure 6:
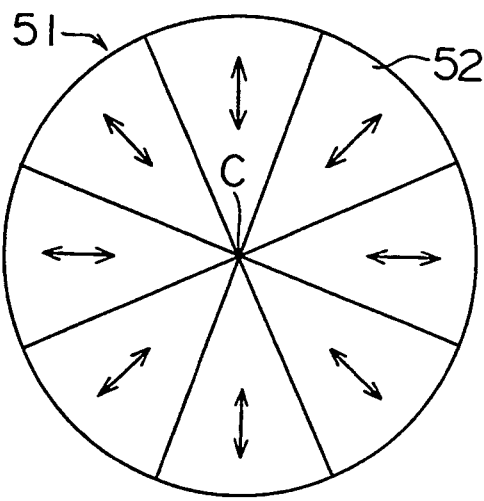
FIG. 6 is a plan view of a polarizer employed in a third embodiment of the present invention.

Also, a polarizer 51 shown in FIG. 6 may be employed. The polarizer 51 consists of a plurality of fan-shaped, i.e., shaped as segments of a circle, linearly polarizing filters 52 which are disposed in a radial fashion around a common center C of the filters 52 so that the entire shape of the polarizer 51 is a circular. The filters 52 are disposed such that they pass therethrough polarized light having planes of polarization in the radial direction, as indicated by bidirectional arrows in FIG. 6. Consequently, light incident on the polarizer parallel to the central axis which passes through the common center C and is perpendicular to the disk is converted into polarized light having radial planes of polarization with respect to the central axis.

Figure 7:
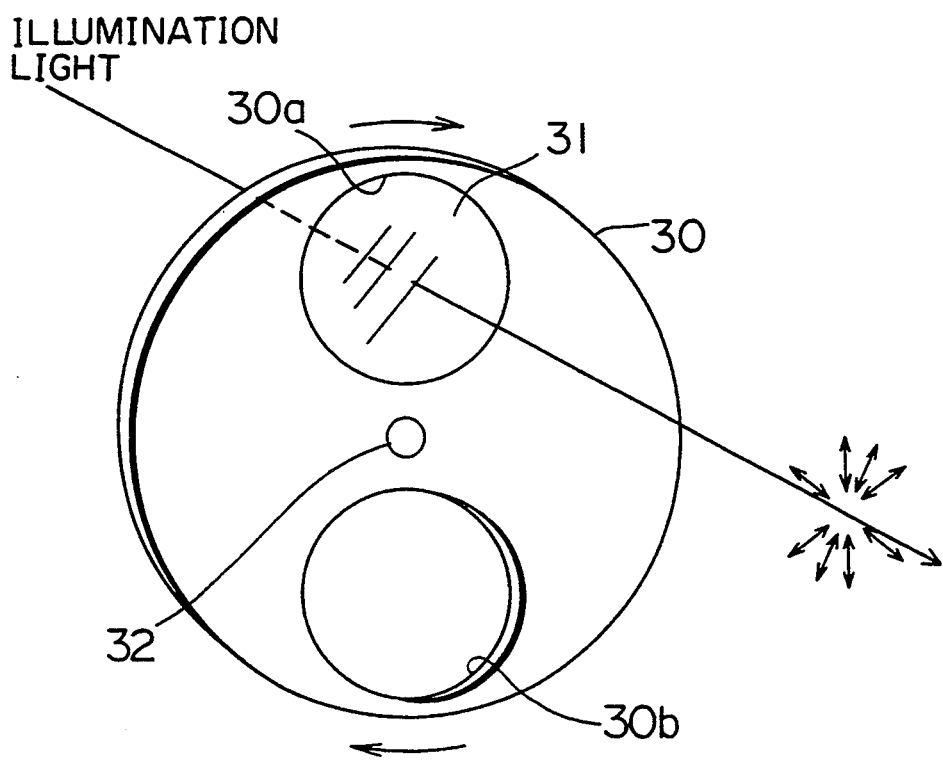
FIG. 7 shows a change-over device employed in a fourth embodiment of the present invention.
Figure 8:
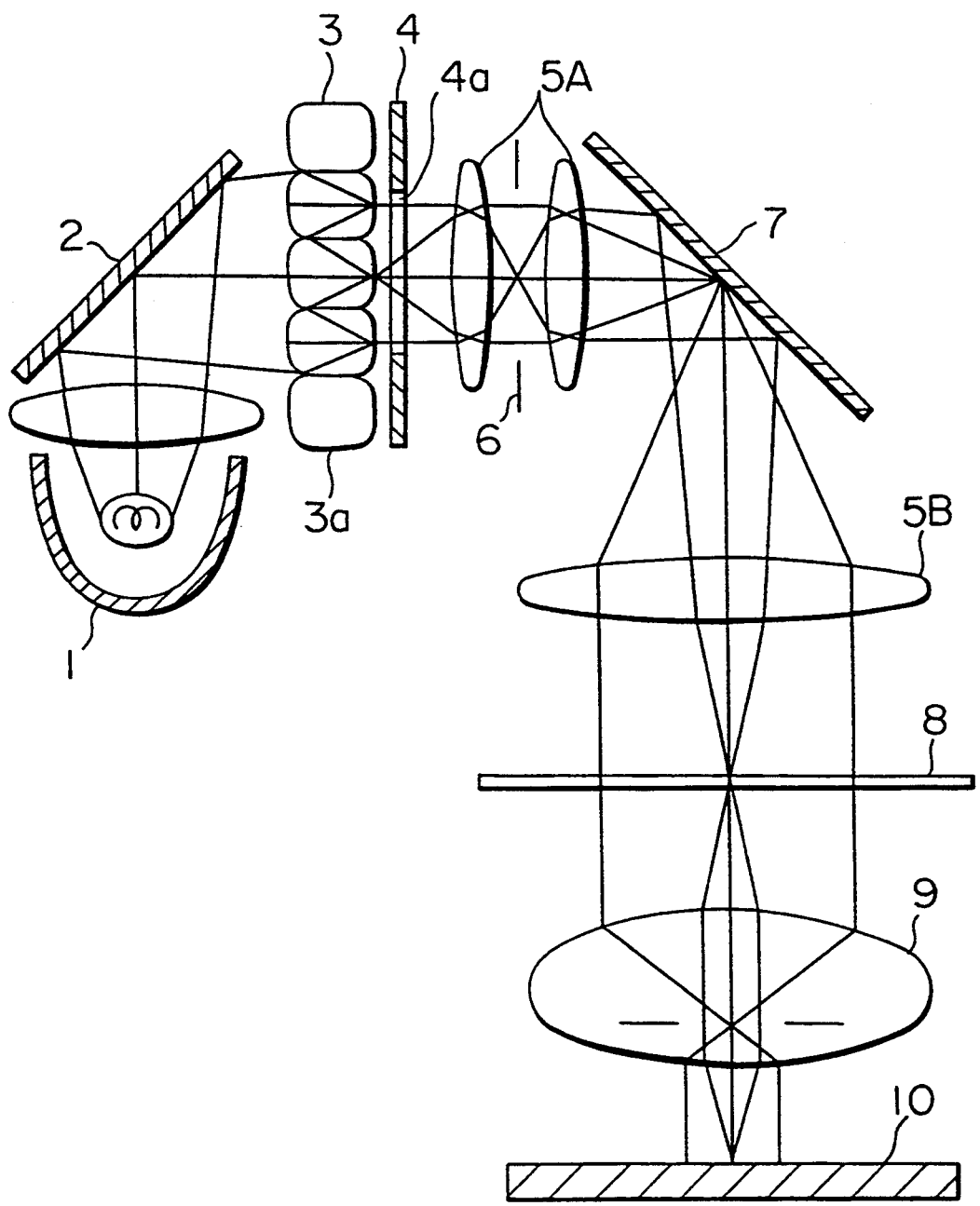
FIG. 8 shows an optical system of a conventional projection exposure apparatus

A polarizer need not be fixedly disposed on the surface of the pupil of the projection lens 19 but be detachably provided. FIG. 7 shows a device used for such an arrangement. A disk-shaped base plate 30 has first and second open portions 30a and 30b. A polarizer 31 for providing radially polarized light is mounted in the first open portion 30a, and no polarizer is provided in the second open portion 30b. The base plate 30 is provided in such a manner as to be rotatable around a central portion 32 thereof. It is therefore possible to selectively locate either of the open portions 30a and 30b on the optical path of an illumination light by rotating the base plate 30. More specifically, polarized light having radial planes of polarization with respect to the optical axis are obtained by selecting the open portion 30a, and a non-polarized illumination light is obtained by selecting the open portion 30b. Thus, selection between polarized light and non-polarized light is made possible for exposure according to an exposure process.

If a reflection-preventing film is formed on the surface of each of the polarizers 21, 31, 41 and 51, generation of the standing light wave can be further restricted, thus improving resist pattern accuracy.

What is claimed is:

1. A projection exposure apparatus comprising:
    a light source for producing source light;
    a condenser lens for condensing the source light from said light source onto a mask including a circuit pattern;
    a projection lens having an optical axis and a pupil including a surface, said projection lens condensing the source light that has passed through the mask onto a surface of a wafer as illumination light; and
    a polarizer disposed on the surface of the pupil of said projection lens, Said polarizer at least principally transmitting as the illumination light that is converged onto the surface of the wafer polarized light having radial planes of polarization intersecting the optical axis of said projection lens.

2. The projection exposure apparatus according to claim 1 wherein said polarizer is disposed detachably on the surface of the pupil of said projection lens.

3. The projection exposure apparatus of claim 1 wherein said polarizer comprises:
    a first conical lens having a concave form, a first axis, and a first index of refraction; and
    a second conical lens having a convex form, a second axis, and a second index of fraction different from the first index of refraction, said second conical lens being fitted into the concave form of said first conical lens so that the first and second axes of said first and second conical lenses are coincident with each other and the optical axis of said projection lens.

4. The projection exposure apparatus of claim 1 wherein said polarizer comprises:
    a plurality of linearly polarizing filters, each filter having a segmental shape with a predetermined central angle, said linearly polarizing filters being disposed radially about a common center intersecting the optical axis of said projection lens and forming a circle lying in a plane perpendicular to the optical axis of said projection lens.

* * * * *